United States Patent [19]
Chen et al.

[11] Patent Number: 6,118,185
[45] Date of Patent: Sep. 12, 2000

[54] SEGMENTED BOX-IN-BOX FOR IMPROVING BACK END OVERLAY MEASUREMENT

[75] Inventors: Jeng-Horng Chen, Taipei; Tsu Shih, Hsin-Chu, both of Taiwan

[73] Assignee: Taiwan Semiconductor Manufacturing Company, Hsin-Chu, Taiwan

[21] Appl. No.: 09/262,303

[22] Filed: Mar. 4, 1999

Related U.S. Application Data

[62] Division of application No. 09/072,990, May 6, 1998, Pat. No. 5,919,714.

[51] Int. Cl.[7] .......................... H01L 23/544; H01L 23/58; H01L 21/76; H01L 21/46; H01L 21/78
[52] U.S. Cl. ........................ 257/797; 257/48; 438/401; 438/462; 438/975
[58] Field of Search ..................... 257/48, 797; 438/401, 438/462, 975

[56] References Cited

U.S. PATENT DOCUMENTS

| | | | |
|---|---|---|---|
| 4,938,600 | 7/1990 | Into | 356/401 |
| 5,017,514 | 5/1991 | Nishimoto | 437/229 |
| 5,292,689 | 3/1994 | Cronin et al. | 438/692 |
| 5,329,334 | 7/1994 | Yim et al. | 355/53 |
| 5,362,669 | 11/1994 | Boyd et al. | 438/692 |
| 5,468,580 | 11/1995 | Tanaka | 430/22 |
| 5,701,013 | 12/1997 | Hsia et al. | 250/491.1 |
| 5,710,050 | 1/1998 | Makita et al. | 438/486 |
| 5,728,507 | 3/1998 | Rhoades et al. | 438/692 |
| 5,747,375 | 5/1998 | Kaneko et al. | 438/759 |
| 6,020,249 | 2/2000 | Shih et al. | 438/401 |

FOREIGN PATENT DOCUMENTS

| | | | |
|---|---|---|---|
| 5-343562 | 12/1993 | Japan | 257/797 |

*Primary Examiner*—David Hardy
*Assistant Examiner*—Allan R. Wilson
*Attorney, Agent, or Firm*—George O. Saile; Stephen B. Ackerman

[57] ABSTRACT

An improvement in the box-in-box overlay measurement method has been achieved by forming the outer box from a segmented trench comprised of a number of concentric ridges that project upwards from the floor of the trench. When the segmented trench has been overfilled with tungsten (or similar metal) the excess metal is removed using either etch-back or chem. mech. polishing as the planarizing technique. Because of the presence of the ridges, the trench (i.e. the outer box) becomes reproducibly easy to see when the inner box (which will be etched from a second layer deposited on the first one) is being positioned inside it. Furthermore, the tendency for the outer box to be broken in critical places (often seen in the prior art) is now largely eliminated.

4 Claims, 7 Drawing Sheets

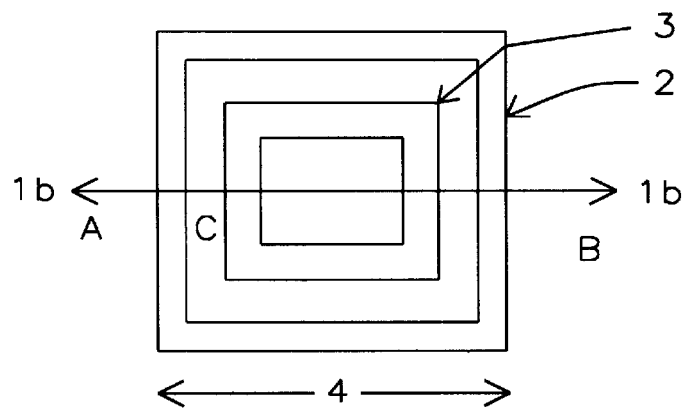
FIG. 1a – Prior Art
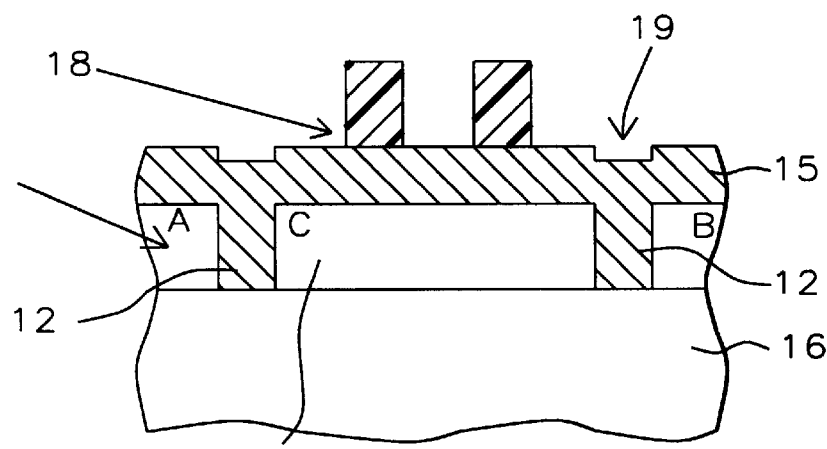
FIG. 1b – Prior Art
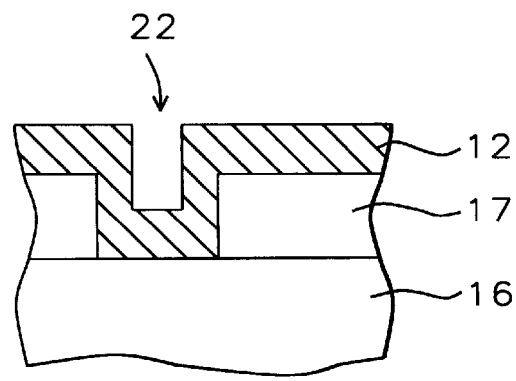
FIG. 2 – Prior Art

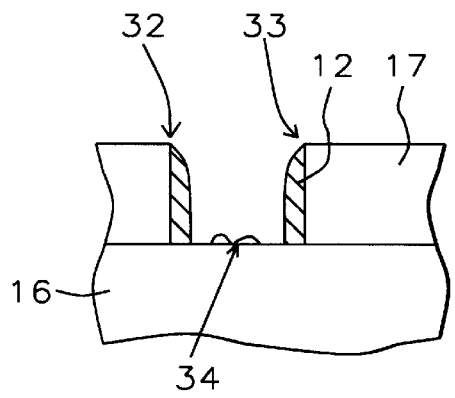
FIG. 3a – Prior Art
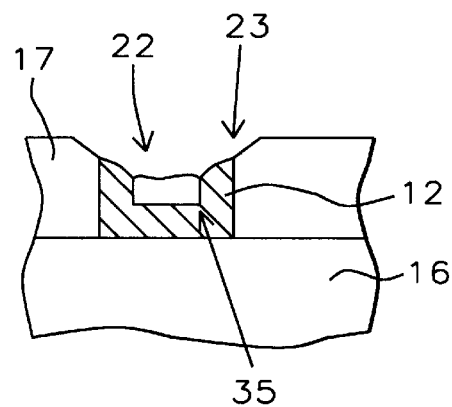
FIG. 3b – Prior Art
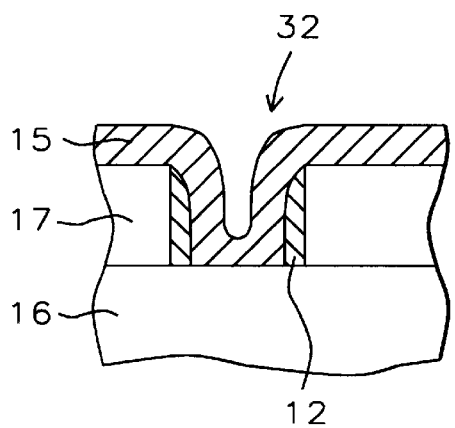
FIG. 4a – Prior Art
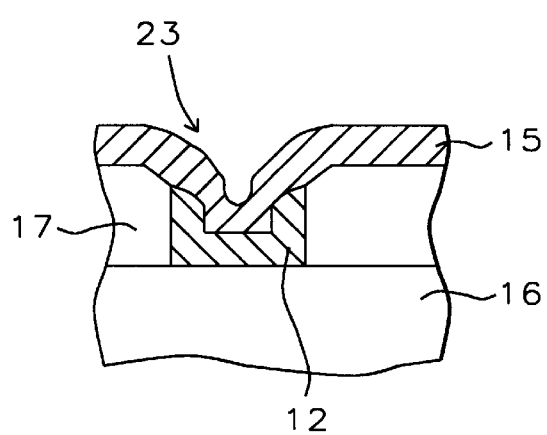
FIG. 4b – Prior Art

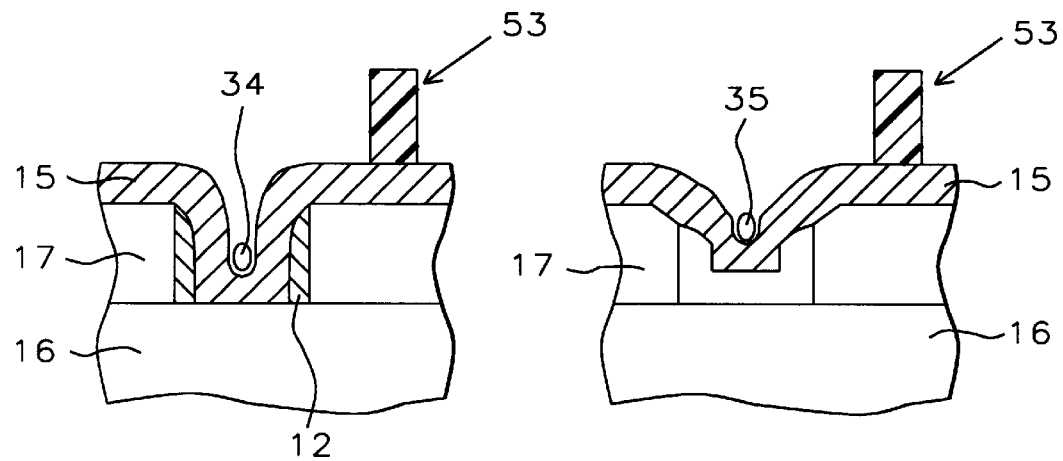
FIG. 5a – Prior Art    FIG. 5b – Prior Art
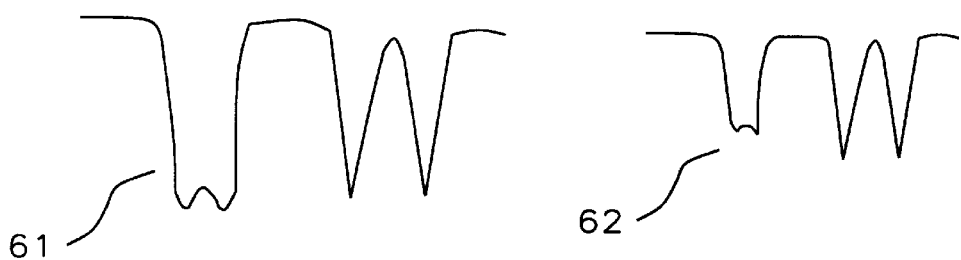
FIG. 6a – Prior Art    FIG. 6b – Prior Art

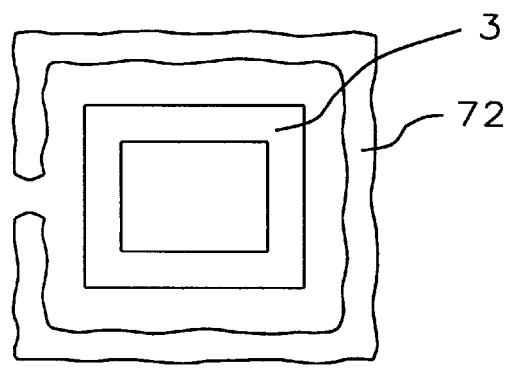
FIG. 7 — Prior Art
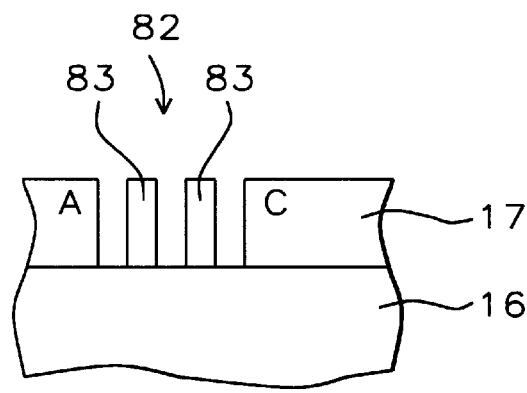
FIG. 8
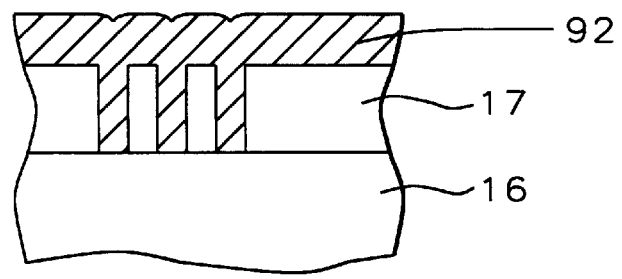
FIG. 9

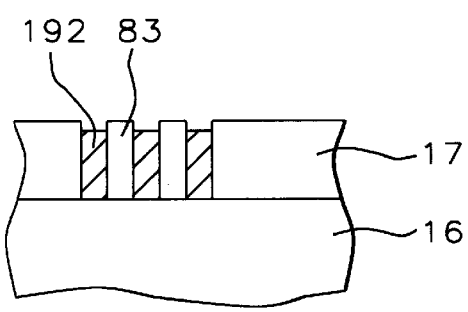
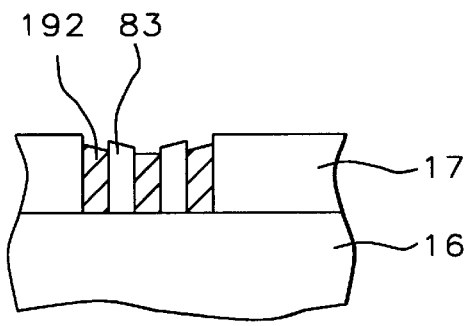
*FIG. 10a*  *FIG. 10b*
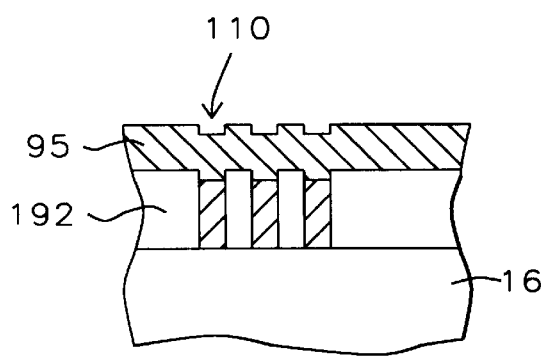
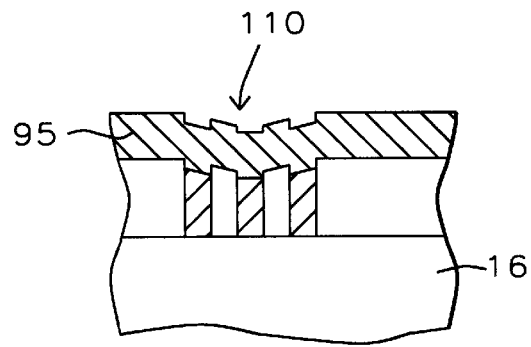
*FIG. 11a*  *FIG. 11b*

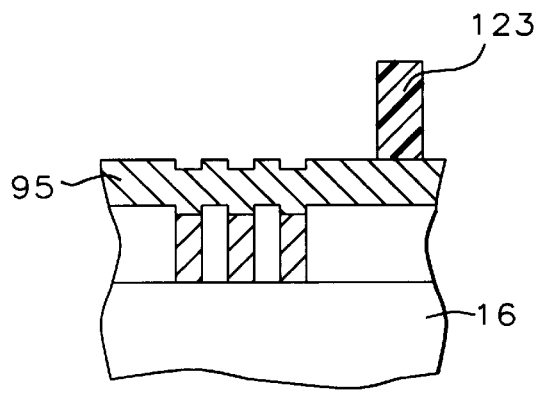 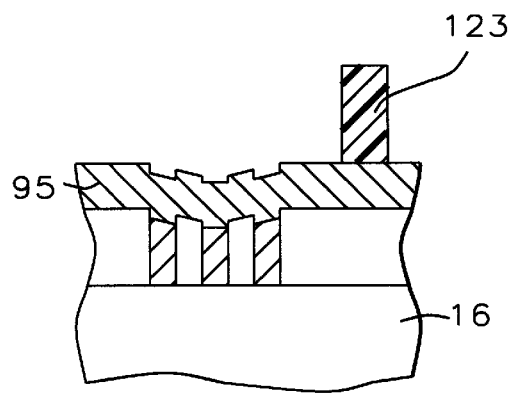
FIG. 12a　　　FIG. 12b
 
FIG. 13a　　　FIG. 13b

SEGMENTED BOX-IN-BOX FOR IMPROVING BACK END OVERLAY MEASUREMENT

This is a division of patent application Ser. No. 09/072,990, filing date May 6, 1998, now U.S. Pat. No. 5,919,714. Segmented Box-In-Box For Improving Back End Overlay Measurement, assigned to the same assignee as the present invention.

FIELD OF THE INVENTION

The invention relates to the general field of photolithography with particular reference to measuring image overlay accuracy by the box-in-box method.

BACKGROUND OF THE INVENTION

Pattern registration has always been a key part of successful photolithography. During the manufacture of integrated circuits many masks are used in succession and, in almost all cases, any given mask will need to be aligned relative to its predecessors with a degree of precision that is at least as well controlled as other pattern-related features such as line width.

A particular example of critical tolerances during pattern registration can be seen in the pattern format known as box-in-box. Referring now to FIG. 1a, we show an outer box 2 which has already been formed by photolithography. Inside 2 a smaller box 3 must be formed in a separate photolithography step. Both boxes have the shape of hollow squares and the tolerances involved are extremely tight. Typically, the long dimension 4 of the outer box would be about 20 microns while that of the inner box would be about 10 microns. Thus, the separation between boxes (for example in the region marked C) is typically about 3 microns.

In practice, to ensure perfect registration between masks, four box-in-box alignments are performed simultaneously, the boxes being located at the four corners of the image field. The outer box is formed from level 1 and the inner box from level 2.

What makes proper box-in-box registration particularly difficult is that the outer box can often be very difficult to measure because of deformation by the planarization process. This can be better understood by reference to FIG. 1b which is a cross-section of FIG. 1a through 1b—1b. The outer box is seen to be a metal filled trench 12 which has been overcoated with a second metal layer 15. The inner box is a photoresist pattern 18 which will be used to protect portions of layer 15 during etching. All that can be seen of the original trench 12 is a shallow step (such as 19) in the top surface of 15. To reliably detect the location of the inner photoresist pattern, an overlay measurement is used.

To better understand how difficulties arise during box-in-box overlay measurement it is instructive to review the two processes that currently precede the box-in-box process itself. Their common starting point is illustrated in FIG. 2 which shows trench 22 that has been formed in oxide layer 17 and then filled with layer 12 (which is typically tungsten although other metals could also have been used). Note that enough metal has been deposited to only partially fill 22. This is because the space is longer than twice the tungsten thickness and the tungsten film is highly conformal.

To remove excess metal everywhere except inside 22 and contact holes, one of two possible methods is used. FIG. 3a illustrates a common result when etch back (using a dry etch) is used. Layer 12 has been unevenly removed from inside 22 leaving behind residue 34 (which comprises tungsten and/or titanium nitride from the barrier layer) along with spacers 33 (that have been roughened as a result of grain growth) on the trench walls and with damage to the metal-oxide interface such as at 32, the latter damage resulting from etching during the over etch stage.

The alternative method for removing excess 12 is chemical mechanical polishing. The common result after using this method is illustrated in FIG. 3b. Although more of layer 12 is seen to have been left in 22, there is still a residue 35 of tungsten oxide (due to tungsten reaction with the slurry) left in the center of 22 and damage at the metal oxide interface, such as 23, can still readily occur.

FIGS. 4a and 4b show the appearance after deposition of the second metal layer (most commonly aluminum-copper, but other metals such as aluminum or aluminum—copper—silicon—with an Anti Reflection Coating of titanium nitride—could also have been used). For the etch back process (4a) as well as for chem. mech. polishing (4b), the trench is seen to have been filled in an uneven and asymmetric manner because of the damage and poor filling of the previous step.

FIGS. 5a and b follow the two processes to the stage where the inner box (photoresist pattern 53) is now in place. For both processes, in order to correctly place 53, the overlay measuring tool traces are shown in FIGS. 6a and 6b. Sub-trace 61 for etch back is seen to be asymmetrical and to have an edge taper which is not sharp enough, and is therefore a potential source of error, while sub-trace 63 for chem. mech. polishing is seen to be unsuitable for the same reasons, usually even more serious in their manifestation.

In addition to the shortcomings in the prior art that lead to registration problems, as discussed above, the damage that occurs (see 23 and 32 above) can often lead to a break in the continuity of the outer box, as illustrated in FIG. 7 for outer box 72. The present invention seeks to remedy this problem as well as to greatly facilitate the registration problem.

Although we were unable to find any prior art that teaches the solution that will be described below, the following references were found to be of interest. Into (U.S. Pat. No. 4,938,600 July 1990) describes a method for displacement between layers wherein systematic errors associated with the measurement system are eliminated by measuring twice, with a 180° rotation between measurements. Tanaka (U.S. Pat. No. 5,468,580 November 1995) shows how differences between successive overlay measurements can be minimized.

Nishimoto (U.S. Pat. No. 5,017,514 May 1991) uses a main vernier pattern formed at right angles to a subsidiary vernier pattern. Yim (U.S. Pat. No. 5,329,334 July 1994) describes a test reticle that includes a number of orthogonally arranged alignment marks of various shapes and sizes.

SUMMARY OF THE INVENTION

It has been an object of the present invention to provide a box-in-box structure whose outer box can be readily detected during an alignment procedure.

Another object of the invention has been to provide a method for manufacturing said box-in-box structure.

Still another object has been that said method lead to an outer box that is complete and that is unbroken at any point along its length.

These objects have been achieved by forming the outer box from a segmented trench comprised of a number of concentric ridges that project upwards from the floor of the trench. After the segmented trench has been overfilled with tungsten (or similar metal) the excess metal is removed using either etch-back or chem. mech. polishing as the planarizing technique. Because of the presence of the ridges, the trench (i.e. the outer box) becomes easy to see when the inner box (which will be etched from a second layer deposited on the first one) is being positioned inside it. Furthermore, the tendency for the outer box to be broken in critical places (often seen in the prior art) is now largely eliminated.

BRIEF DESCRIPTION OF THE DRAWINGS

FIG. 1a illustrates the basic box-in-box structure that is used as an alignment aid during the manufacture of integrated circuits.

FIG. 1b is a schematic cross-section taken through the structure shown in FIG. 1a.

FIGS. 2–5b illustrate steps taken to generate a box-in-box structure with the a) series referring to planarization achieved by etch-back and the b) series referring to planarization achieved by chem. mech. polishing.

FIGS. 6a and 6b show traces made by the overlay tool used to assist in placing the inner box correctly.

FIG. 7 shows a damaged box-in-box structure of a type often obtained when the prior art methodology is used.

FIG. 8 is a schematic cross-section of part of the outer box where a segmented trench has replaced the conventional trench.

FIG. 9 shows a segmented trench after overfilling with the first metal layer.

FIGS. 10a–12b illustrate steps taken to complete the box-in-box structure with the a) series referring to planarization achieved by etch-back and the b) series referring to planarization achieved by chem. mech. polishing.

FIGS. 13a and 13b show traces made by the overlay tool used to assist in placing the innner box correctly.

DESCRIPTION OF THE PREFERRED EMBODIMENTS

Figure 14:
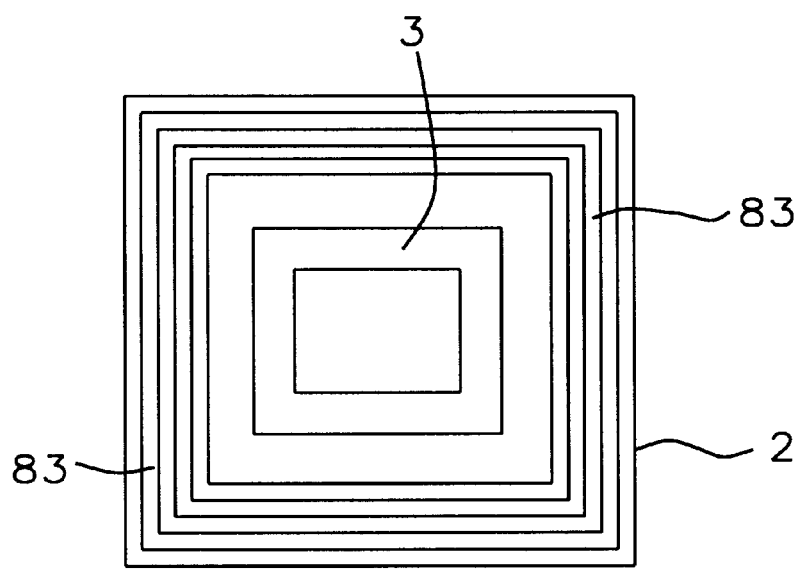
FIG. 14 is a plan view of a completed box-in-box made according to the teaching of the present invention.

As was discussed above, box-in-box overlay measurement is a convenient way to measure overlay between successive masks. Usually, four box-in-box measurements are performed simultaneously, the boxes being located at the four corners of the image field. In the prior art, as shown in FIGS. 5a and 5b, the outer mask is often very difficult to measure accurately, particularly when automatic tools such as an overlay tool are being used.

The concept which the present invention discloses, in order to facilitate box-in-box overlay measurement, is illustrated in FIG. 8. As in the conventional methodology, the starting point is a layer 17 of oxide on semiconductor 16, such as silicon or germanium or gallium arsenide, with silicon being preferred. Such a structure would, in general, be part of a partially completed integrated circuit.

Continuing our reference to FIG. 8, we note there a key departure from prior art practice. Trench 82 (which defines the outer box) is not a simple hollow square with a flat bottom. Instead, the trench is segmented, being made up of a series of concentric ridges 83. In FIG. 8 the number of ridges shown is 2 but the actual number used in practice will depend on the requirements of the particular measurement tool and on processing conditions such as photoprocesses, metal thickness, chemical mechanical polishing, etc. The ridges are formed by masking and etching during the same step normally used to prepare the flat bottomed trench. Typically, the segmented trench has a depth that depends on the processing conditions, with each ridge having a width that is between about 0.4 microns and 2 times the thickness of the tungsten.

Once the segmented trench has been formed, it is overfilled with a layer of metal 92 (see FIG. 9) such as tungsten to a thickness between about 2,000 and 8,000 Angstroms, following which the excess metal is removed by one of the two planarizing techniques discussed earlier. The appearance after etch-back is illustrated in FIG. 10a. Etch-back was performed using a dry etch. The appearance after chem. mech. polishing can be seen in FIG. 10b. Former metal layer 92 is, in its planarized form, designated as 192.

The next step is deposition of the second metal layer 95, as shown in FIGS. 11a (etch-back case) and in FIG. 11b (chem. mech. polished case). Layer 95 is aluminum, aluminum—copper, or aluminum—copper—silicon and its thickness is between about 3,000 Angstroms and several microns. Note that, because of the ridges within the trench, depressions, such as 110, in the surface of 95 are formed. Such depressions are easily detected and, even if one of the depressions occasionally fills with debris (at the point where a measurement is being made), nearby depressions will still be available for detection by the overlay tool (see below).

With the outer box now formed, the top surface of layer 95 is coated with a layer of photoresist, which is then exposed and developed into pattern 123 (FIGS. 12a and 12b). This is the inner box, whose left side is seen in the figure, which must be located entirely at the center of the first box if proper alignment is to be achieved. To confirm that there is no overlap between the two boxes, traces, illustrated in FIGS. 13a and 13b were made using standard scanning equipment. Note the appearance of subtraces 131 and 132 which are highly reproducible and predictable because the segment structure is filled with tungsten. This reduces the likelihood of damage to the box, making for reliable detection of the location of the outer box.

In FIG. 14 we show a plan view of a completed box-in-box made according to the teaching of the present invention. Note that the presence of the ridges ensures not only good overlay measurement between boxes but also eliminates occurence of the type of break in the outer box that can be seen in FIG. 7. This is because the trench is filled with tungsten oxide residue and has been planarized by the chem. mech. polishing process.

While the invention has been particularly shown and described with reference to the preferred embodiments thereof, it will be understood by those skilled in the art that various changes in form and details may be made without departing from the spirit and scope of the invention.

What is claimed is:

1. An outer box for use in box-in-box overlay measurement, comprising:

a silicon wafer having a silicon oxide layer in which is formed a tungsten filled segmented trench in the shape of a box, said tungsten has a thickness; and a layer of aluminum—copper forming two or more concentric ridges over said tungsten filled segmented trench.

2. The outer box of claim 1 wherein the segmented trench has a width between about 0.4 microns and 2 times the thickness of the tungsten.

3. The outer box of claim 2 wherein the concentric ridges each have a width that is less than about twice the thickness of the tungsten layer.

4. The outer box of claim 1 wherein the aluminum—copper layer is between about 4,000 and 8,000 Angstroms thick.

* * * * *